(12) United States Patent  
Ko et al.

(10) Patent No.: US 9,324,705 B2
(45) Date of Patent: Apr. 26, 2016

(54) LATERAL BIPOLAR JUNCTION TRANSISTOR

(71) Applicant: MEDIATEK INC., Hsin-Chu (TW)

(72) Inventors: Ching-Chung Ko, Hsinchu County (TW); Tung-Hsing Lee, New Taipei (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/161,611

(22) Filed: Jan. 22, 2014

(65) Prior Publication Data

US 2014/0124871 A1    May 8, 2014

Related U.S. Application Data

(63) Continuation of application No. 12/389,378, filed on Feb. 20, 2009, now Pat. No. 8,674,454.

(51) Int. Cl.
| | |
|---|---|
| *H01L 29/735* | (2006.01) |
| *H01L 29/66* | (2006.01) |
| *H01L 27/06* | (2006.01) |
| *H01L 21/8249* | (2006.01) |
| *H01L 29/08* | (2006.01) |
| *H01L 29/06* | (2006.01) |

(52) U.S. Cl.
    CPC ........ *H01L 27/0623* (2013.01); *H01L 21/8249* (2013.01); *H01L 29/0821* (2013.01); *H01L 29/6625* (2013.01); *H01L 29/735* (2013.01); *H01L 29/0649* (2013.01); *H01L 29/0692* (2013.01)

(58) Field of Classification Search
    None
    See application file for complete search history.

(56) References Cited

U.S. PATENT DOCUMENTS

| | | | |
|---|---|---|---|
| 5,139,961 | A | 8/1992 | Solheim et al. |
| 5,219,784 | A | 6/1993 | Solheim |
| 5,424,572 | A | 6/1995 | Solheim |
| 5,717,241 | A | 2/1998 | Malhi |
| 7,326,998 | B1 | 2/2008 | O |
| 7,468,303 | B2 | 12/2008 | Sugihara |
| 7,701,038 | B2 | 4/2010 | Chen |
| 7,723,803 | B2 | 5/2010 | Chung |
| 2004/0027745 | A1 | 2/2004 | Kunz |
| 2006/0011943 | A1 | 1/2006 | Howard |
| 2006/0105517 | A1 | 5/2006 | Johansson |
| 2007/0105301 | A1 | 5/2007 | Chen |
| 2007/0148889 | A1 | 6/2007 | Kim |
| 2008/0067585 | A1 | 3/2008 | Williams |
| 2008/0191238 | A1 | 8/2008 | Madathil |
| 2008/0237706 | A1 | 10/2008 | Williams |
| 2009/0045467 | A1 | 2/2009 | Kakoschke |
| 2009/0309167 | A1* | 12/2009 | Russ et al. ............ 257/370 |
| 2010/0252860 | A1* | 10/2010 | Yang ............ H01L 29/0692 257/133 |

FOREIGN PATENT DOCUMENTS

| | | |
|---|---|---|
| CN | 1604340 A | 4/2005 |
| CN | 1838431 A | 9/2006 |
| CN | 100461413 C | 2/2009 |
| GB | 1217880 A | 12/1970 |
| TW | 559857 | 11/2003 |

* cited by examiner

*Primary Examiner* — Pamela E Perkins
(74) *Attorney, Agent, or Firm* — Winston Hsu; Scott Margo

(57) ABSTRACT

A lateral bipolar junction transistor includes an emitter region; a base region surrounding the emitter region; a gate disposed at least over a portion of the base region; and a collector region surrounding the base region; wherein the portion of the base region under the gate does not under go a threshold voltage implant process.

5 Claims, 13 Drawing Sheets

LATERAL BIPOLAR JUNCTION TRANSISTOR

CROSS REFERENCE TO RELATED APPLICATIONS

This application is a continuation of U.S. application Ser. No. 12/389,378 filed Feb. 20, 2009, which is included in its entirety herein by reference.

BACKGROUND OF THE INVENTION

1. Field of the Invention

The invention relates to the field of semiconductor technology and, more particularly, to a CMOS-based lateral bipolar junction transistor (lateral BJT) with high beta.

2. Description of the Prior Art

Bipolar junction transistors or bipolar transistors, which are formed using a CMOS compatible process, are well known in the art. These bipolar transistors are also referred to as lateral bipolar junction transistors and have high threshold frequency (Ft) and high beta.

In the design of semiconductor integrated circuits, it is often desirable to provide a mixed mode device, i.e., which has both BJT and CMOS functions. Mixed mode devices both increase the flexibility of the IC design and increase the performance of the IC. The integration of CMOS transistors with bipolar transistors to provide Bipolar-CMOS (BiCMOS) integrated circuits is now well established. BiCMOS circuits provide advantages such as high speed, high drive, mixed voltage performance with analog-digital capabilities, which are beneficial in applications such as telecommunications. However, there is considerable challenge in optimizing the performance of both CMOS and bipolar devices fabricated with progressively reduced dimensions. In order to fabricate an integrated circuit combining both bipolar transistors and field effect transistors on the same chip, compromises must be made during both design and fabrication to optimize performance of both bipolar and field effect transistors, without inordinately increasing the number of processing steps.

The lateral bipolar transistor is fabricated using a typical lightly doped drain (LDD) MOS transistor. An NPN device is formed from an NMOS transistor and a PNP device is formed from a PMOS transistor. The base width of the lateral bipolar transistor is determined by and is usually equal to the MOS channel length. It is desirable to have a CMOS-based bipolar transistor having improved bipolar performance.

SUMMARY OF THE INVENTION

It is one object of this invention to provide a CMOS-based lateral bipolar junction transistor (lateral BJT) with high beta.

To achieve the goal of the invention, a method for fabricating a lateral bipolar junction transistor is provided. The invention method comprises the steps of: providing a substrate; providing a threshold voltage implant block layer to mask at least a portion of the substrate; performing a threshold voltage implant process, wherein the threshold voltage implant block layer blocks dopants of the threshold voltage implant process from doping into the at least a portion of the substrate; removing the threshold voltage implant block layer; and forming a gate over the at least a portion of the substrate.

According to another aspect of the claimed invention, a lateral bipolar junction transistor includes an emitter region; a base region surrounding the emitter region; a gate disposed at least over a portion of the base region; and a collector region surrounding the base region; wherein the portion of the base region under the gate does not undergo a threshold voltage implant process.

According to still another aspect of the claimed invention, a lateral NPN bipolar junction transistor includes an $N^+$ emitter region; a native, P type base region that is a portion of a P type semiconductor substrate surrounding the $N^+$ emitter region; a gate disposed at least over a portion of the native, P type base region; an $N^+$ collector region surrounding the native, P type base region; a salicide block layer disposed over at least a portion of a periphery of the emitter region; and an emitter salicide formed on a central portion of the emitter region that is not covered by the salicide block layer.

These and other objectives of the present invention will no doubt become obvious to those of ordinary skill in the art after reading the following detailed description of the preferred embodiment that is illustrated in the various figures and drawings.

DETAILED DESCRIPTION

The structure and layout of the present invention lateral bipolar junction transistor (LBJT) with higher current gain are described in detail. The improved LBJT structure is described for a lateral PNP bipolar transistor, but it should be understood by those skilled in the art that by reversing the polarity of the conductive dopants lateral NPN bipolar transistors can be made.

Figure 1:
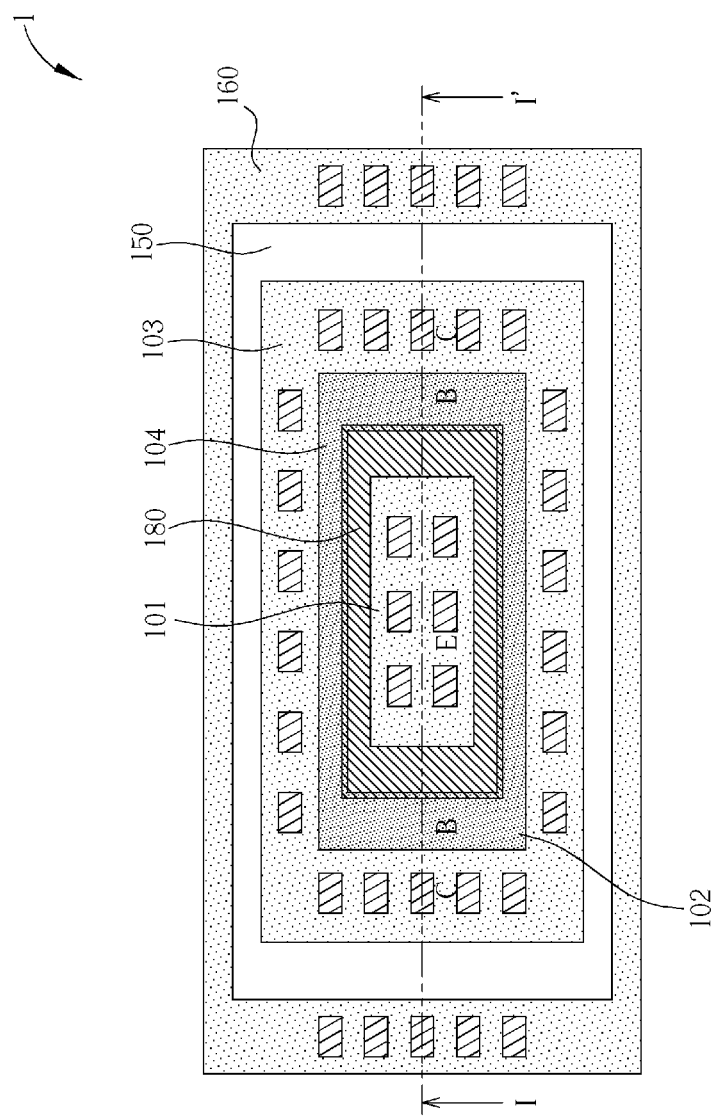
FIG. 1 is a top planar view of a layout of the substantially concentric lateral bipolar transistor according to one embodiment of the invention.
Figure 2:
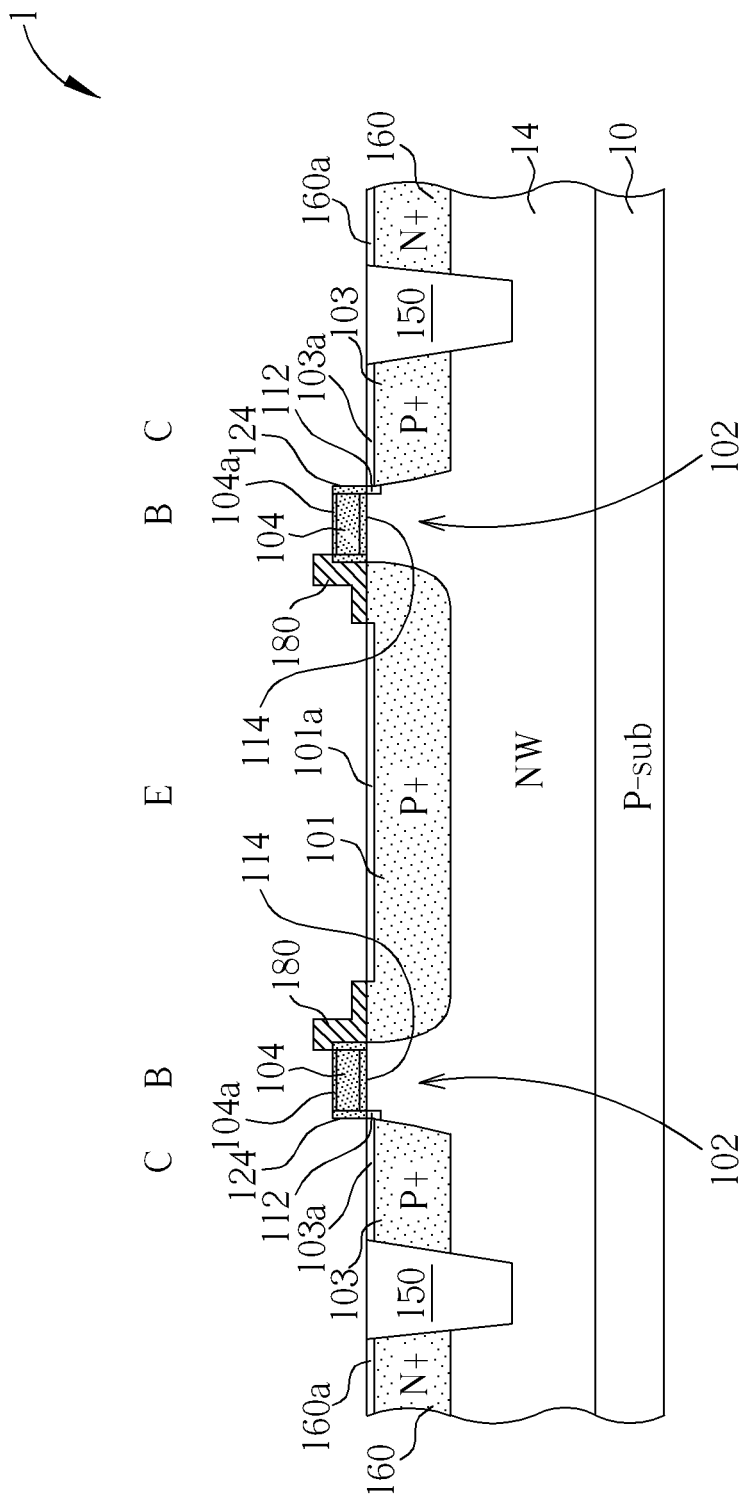
FIG. 2 is a schematic, cross-sectional view of the transistor in FIG. 1, taken along line I-I' of FIG. 1.

Please refer to FIG. 1 and FIG. 2. FIG. 1 is a top planar view of a layout of the substantially concentric lateral bipolar transistor according to one embodiment of the invention. FIG. 2 is a schematic, cross-sectional view of the transistor in FIG. 1, taken along line I-I' of FIG. 1. As shown in FIG. 1 and FIG. 2, the lateral PNP bipolar transistor 1 is formed in a semiconductor substrate 10 such as a P type doped silicon substrate. The lateral PNP bipolar transistor 1 comprises a $P^+$ doping region 101 that functions as an emitter region of the lateral PNP bipolar transistor 1, which is formed within an N well (NW) 14. The rectangular shape of the emitter region 101 as set forth in FIG. 1 is merely exemplary. It is understood that the emitter region 101 may have other polygonal shapes.

A base region 102 underlying an annular polysilicon gate 104 is disposed about a periphery of the emitter region 101. A voltage can be applied on the polysilicon gate 104 to change the characteristics of the lateral PNP bipolar transistor 1. An annular $P^+$ doping region 103 that functions as a collector region of the lateral PNP bipolar transistor 1 is formed within the N well 14 and is disposed about a periphery of the base region 102. A shallow trench isolation (STI) region 150 is disposed about a periphery of the collector region 103 and surrounds the collector region 103. An annular $N^+$ well pickup region 160 or base contact is disposed about a periphery of the STI region 150.

According to the present invention, the N well 14, the emitter region 101, the collector region 103, the STI region 150, the $N^+$ well pickup region 160 and the polysilicon gate 104 may be formed with the formation of respective diffusion regions and gate of CMOS devices. The polysilicon gate 104 serves as an implant blockout mask during the formation of the emitter region 101 and the collector region 103.

As best seen in FIG. 2, agate dielectric layer 114 is provided between the polysilicon gate 104 and the base region 102. Preferably, the gate dielectric layer 114 is formed simultaneously with the formation of gate oxide layer in CMOS devices for input/output (I/O) circuits. Accordingly, the gate dielectric layer 114 underlying the polysilicon gate 104 of the lateral PNP bipolar transistor 1 has a thickness that is substantially equal to that of the gate oxide layer in CMOS devices for I/O circuits. By doing this, gate current (Ig) and GIDL (gate induced drain leakage) can be both reduced. On the two opposite sidewalls of the polysilicon gate 104, spacers 124 are provided.

It is one germane feature of the present invention that the collector region 103 further comprises a P type lightly doped drain (PLDD) 112 that is situated directly underneath the spacer 124 only on the side that is adjacent to the collector region 103, while on the other side adjacent to the emitter region 101, no LDD is provided. In one aspect, the single sided PLDD 112 may be deemed a collector extension. Preferably, the PLDD 112 is formed simultaneously with the formation of LDD regions in CMOS devices. To form the single sided PLDD 112, a LDD block layer may be introduced into the fabrication process of the lateral PNP bipolar transistor 1. Further, a threshold voltage (Vt) implant block layer may be introduced into the fabrication process of the lateral PNP bipolar transistor 1 in order to create a lower doping base.

As shown in FIG. 1 and FIG. 2, an annular salicide block (SAB) layer 180 is formed over at least a portion of a periphery of the emitter region 101 and may extend up to the surface of the spacer 124 facing the emitter region 101. The SAB layer 180 may extend to the top surface of the polysilicon gate 104. According to the embodiments of this invention, the SAB layer 180 may be composed of a dielectric material such as silicon oxide or silicon nitride. After the formation of the SAB layer 180, an emitter salicide 101a is formed on the exposed portion of the emitter region 101. Thus, the emitter salicide 101a is pulled back from the periphery of the emitter region 101. In addition, a collector salicide 103a, a polycide 104a, and a base salicide 160a are formed on the collector region 103, on the gate 104 and on the annular $N^+$ well pickup region 160, respectively.

The salicides 101a, 103a, 104a and 160a may be formed by depositing a metal over the substrate 10. Such metal reacts with the semiconductor material of the exposed regions to form the salicides, which provides low resistance contact to the emitter, the base and the collector of the lateral PNP bipolar transistor 1. The SAB layer 180 prevents formation of the emitter salicide 101a at the periphery of the emitter region 101 adjacent to the edge of the spacer 124 facing the emitter region 101. It is noteworthy that no SAB layer is formed on the collector region 103 or on the spacer facing the collector region 103. By providing the SAB layer 180 in the lateral PNP bipolar transistor 1, the leakage current through the base is minimized and therefore beta can be increased.

Figure 3:
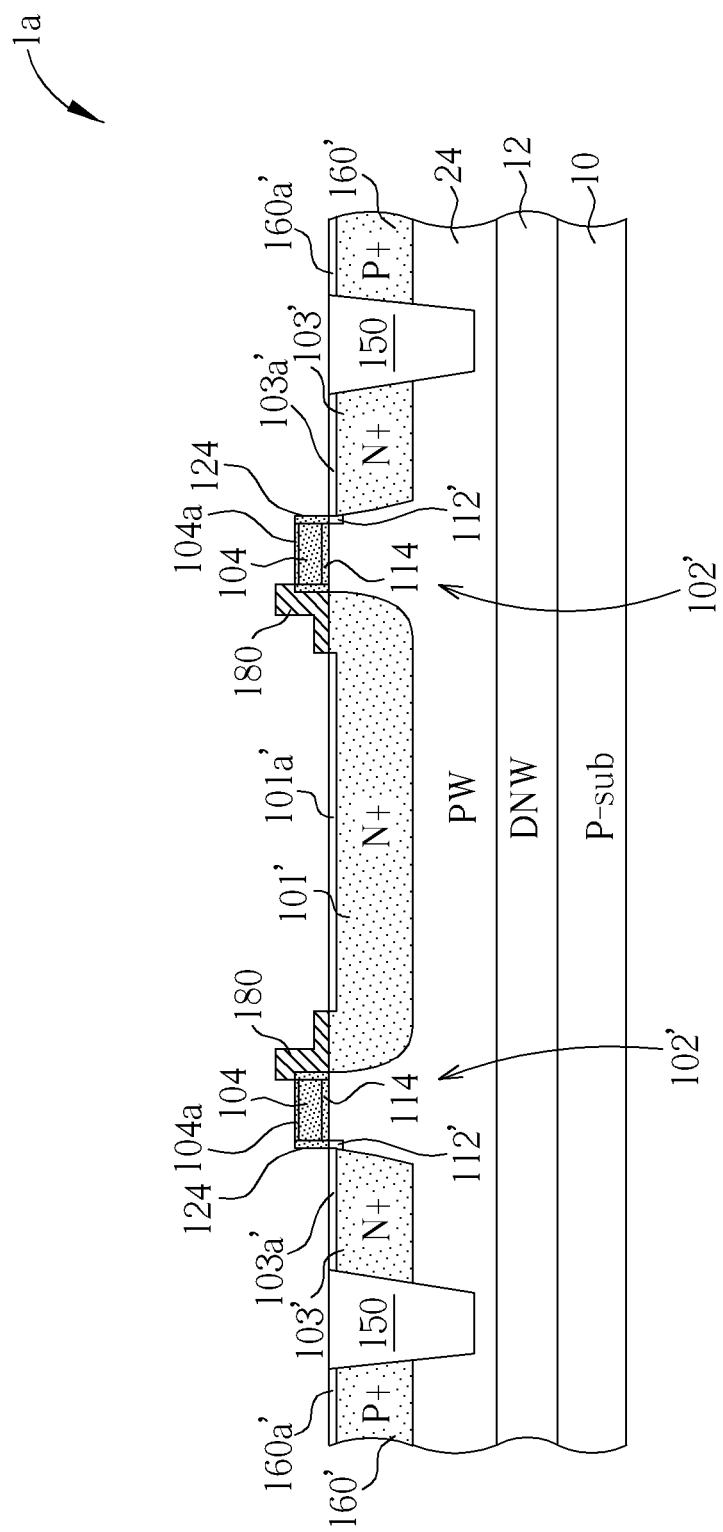
FIG. 3 is a schematic, cross-sectional view of a lateral NPN bipolar transistor in accordance with another embodiment of this invention.

FIG. 3 is a schematic, cross-sectional view of a lateral NPN bipolar transistor 1a in accordance with another embodiment of this invention, wherein like numeral numbers designate like regions, layers or elements. As shown in FIG. 3, the lateral NPN bipolar transistor 1a is formed within a P well (PW) 24. A deep N well (DNW) 12 is provided under the P well 24 in a semiconductor substrate 10 such as a P type doped silicon substrate. The lateral NPN bipolar transistor 1a comprises an $N^+$ doping region 101' that functions as an emitter region of the lateral NPN bipolar transistor 1a, which is formed within the semiconductor substrate 10.

A base region 102', which is a portion of the intrinsic semiconductor substrate 10 underlying an annular polysilicon gate 104 in this embodiment, is disposed about a periphery of the emitter region 101'. A voltage can be applied on the polysilicon gate 104 to change the characteristics of the lateral NPN bipolar transistor 1a. An annular $N^+$ doping region 103' that functions as a collector region of the lateral NPN bipolar transistor 1a is formed within the semiconductor substrate 10 and is disposed about a periphery of the base region 102'. A shallow trench isolation (STI) region 150 is disposed about a periphery of the collector region 103' and surrounds the collector region 103'. An annular $P^+$ base contact 160' is disposed about a periphery of the STI region 150.

According to the present invention, the emitter region 101', the collector region 103', the STI region 150, the $P^+$ base contact 160' and the polysilicon gate 104 may be formed with the formation of respective diffusion regions and gate of CMOS devices. Likewise, the polysilicon gate 104 serves as an implant blockout mask during the formation of the emitter region 101' and the collector region 103'. A gate dielectric layer 114 is provided between the polysilicon gate 104 and the base region 102'. Preferably, the gate dielectric layer 114 is formed simultaneously with the formation of gate oxide layer in CMOS devices for I/O circuits. Accordingly, the gate dielectric layer 114 underlying the polysilicon gate 104 of the lateral NPN bipolar transistor 1a may have a thickness that is substantially equal to that of the gate oxide layer in CMOS devices for I/O circuits. On the two opposite sidewalls of the polysilicon gate 104, spacers 124 are provided.

The collector region 103' further comprises an N type lightly doped drain (NLDD) 112' that is situated directly underneath the spacer 124 only on the side that is adjacent to the collector region 103', while on the other side adjacent to the emitter region 101', no LDD is provided. Preferably, the NLDD 112' is formed simultaneously with the formation of LDD regions in CMOS devices. To form the single sided NLDD 112', a LDD block layer may be introduced into the fabrication process of the lateral NPN bipolar transistor 1a. Further, a threshold voltage (Vt) implant block layer may be introduced into the fabrication process of the lateral NPN bipolar transistor 1a in order to create a lower doping base. An annular SAB layer 180 is formed over periphery portion of the emitter region 101' and may extend up the surface of the spacer 124 facing the emitter region 101' or may extend to the top surface of the polysilicon gate 104. The SAB layer 180 may be composed of a dielectric material such as silicon oxide or silicon nitride. After the formation of the SAB layer 180, an emitter salicide 101a' is formed on the exposed portion of the emitter region 101'. Thus, the emitter salicide 101a' is pulled back from the periphery of the emitter region 101'. In addition, a collector salicide 103a', a polycide 104a, and abase salicide 160a' are formed on the collector region 103', on the gate 104 and on the annular $P^+$ base contact 160', respectively. The SAB layer 180 prevents formation of the emitter salicide 101a' at the periphery of the emitter region 101' adjacent to the edge of the spacer 124 facing the emitter region 101'. It is noteworthy that no SAB layer is formed on the collector region 103' or on the spacer 124 facing the collector region 103'. For the lateral NPN BJT layout as depicted in FIG. 3, the DNW 12 improves 1/f noise.

Figure 4:
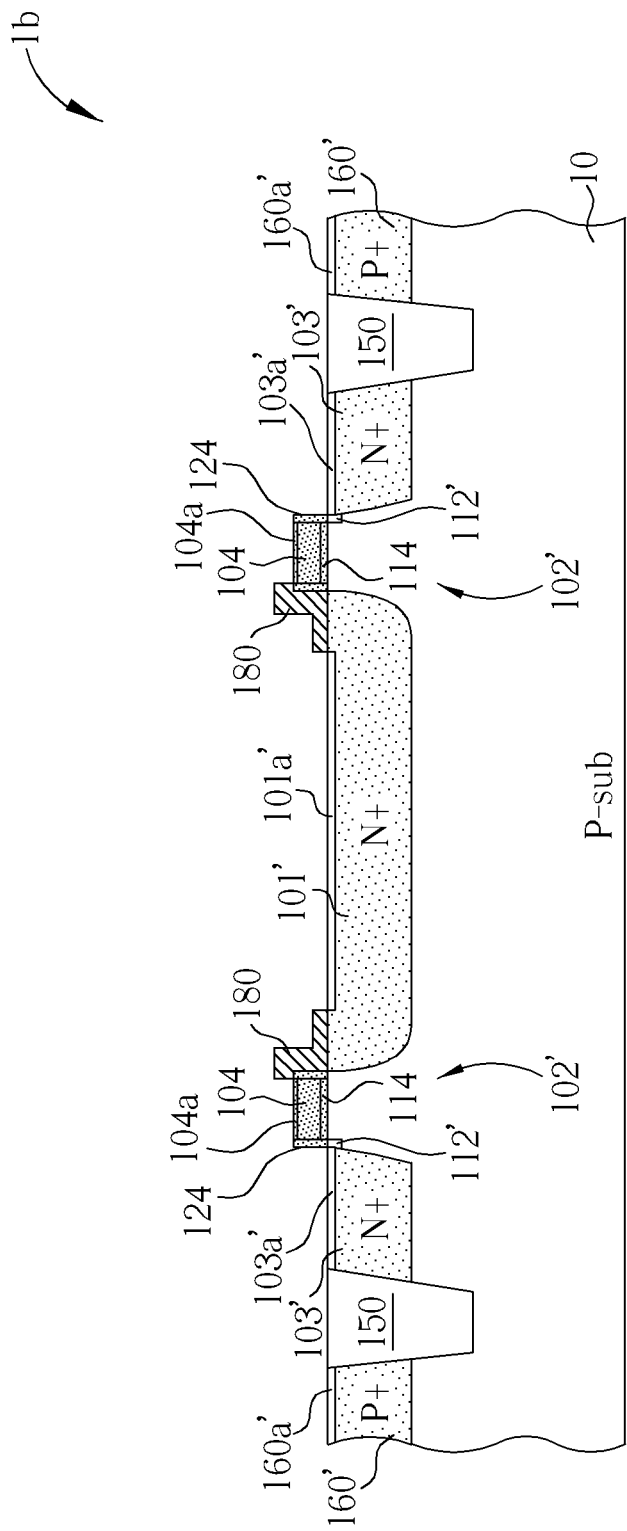
FIG. 4 is a schematic, cross-sectional view of a lateral NPN bipolar transistor in accordance with yet another embodiment of this invention.

FIG. 4 is a schematic, cross-sectional view of a lateral NPN bipolar transistor 1b in accordance with yet another embodiment of this invention, wherein like numeral numbers designate like regions, layers or elements. As shown in FIG. 4, instead of forming in a P well, the lateral NPN bipolar transistor 1b is formed in a semiconductor substrate 10 such as a P type doped silicon substrate. The lateral NPN bipolar transistor 1b comprises an $N^+$ doping region 101' that functions as an emitter region of the lateral NPN bipolar transistor 1b, which is formed within the semiconductor substrate 10. A base region 102', which is a portion of the semiconductor substrate 10 underlying an annular polysilicon gate 104, is disposed about a periphery of the emitter region 101'. An annular $N^+$ doping region 103' that functions as a collector region of the lateral NPN bipolar transistor 1b is formed within the semiconductor substrate 10 and is disposed about a periphery of the base region 102'. A shallow trench isolation (STI) region 150 is disposed about a periphery of the collector region 103' and surrounds the collector region 103'. An annular $P^+$ base contact 160' is disposed about a periphery of the STI region 150.

The polysilicon gate 104 serves as an implant blockout mask during the formation of the emitter region 101' and the collector region 103'. A gate dielectric layer 114 is provided between the polysilicon gate 104 and the base region 102'. Preferably, the gate dielectric layer 114 is formed simultaneously with the formation of gate oxide layer in CMOS devices for I/O circuits. Accordingly, the gate dielectric layer 114 underlying the polysilicon gate 104 of the lateral NPN bipolar transistor 1b may have a thickness that is substantially equal to that of the gate oxide layer in CMOS devices for I/O circuits. On the two opposite sidewalls of the polysilicon gate 104, spacers 124 are provided.

The collector region 103' further comprises an N type lightly doped drain (NLDD) 112' that is situated directly underneath the spacer 124 only on the side that is adjacent to the collector region 103', while on the other side adjacent to the emitter region 101', no LDD is provided. Preferably, the NLDD 112' is formed simultaneously with the formation of LDD regions in CMOS devices. To form the single sided NLDD 112', a LDD block layer may be introduced into the fabrication process of the lateral NPN bipolar transistor 1b. Further, a threshold voltage (Vt) implant block layer may be introduced into the fabrication process of the lateral NPN bipolar transistor 1b in order to create a lower doping base. Likewise, an annular SAB layer 180 is formed over periphery portion of the emitter region 101' and may extend up the surface of the spacer 124 facing the emitter region 101' or may extend to the top surface of the polysilicon gate 104. The SAB layer 180 may be composed of a dielectric material such as silicon oxide or silicon nitride. After the formation of the SAB layer 180, an emitter salicide 101a' is formed on the exposed portion of the emitter region 101'. The emitter salicide 101a' is pulled back from the periphery of the emitter region 101'. In addition, a collector salicide 103a', a polycide 104a, and a base salicide 160a' are formed on the collector region 103', on the gate 104 and on the annular $P^+$ base contact 160, respectively. The SAB layer 180 prevents formation of the emitter salicide 101a' at the periphery of the emitter region 101' adjacent to the edge of the spacer 124 facing the emitter region 101'. No SAB layer is formed on the collector region 103' or on the spacer 124 facing the collector region 103'.

FIG. 5 to FIG. 13 are schematic, cross-sectional diagrams demonstrating the process for fabricating the lateral NPN bipolar transistor 1a of FIG. 3 according to this invention, wherein like numeral numbers designate like layers, regions or elements. It is to be understood that the fabrication process through FIG. 5 to FIG. 13 may be combined with SiGe technology and/or BiCMOS process. The steps shown in FIGS. 5-13 may be optional and arranged in different orders to fabricate different lateral bipolar transistors according to the present invention.

Figure 5:
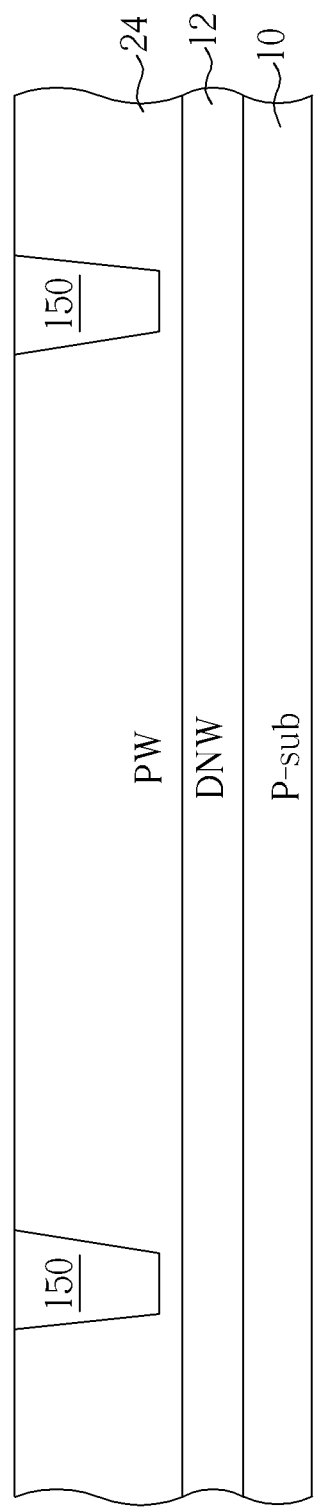
FIG. 5 to FIG. 13 are schematic, cross-sectional diagrams demonstrating the process for fabricating a lateral NPN bipolar transistor according to this invention.

As shown in FIG. 5, a substrate 10 such as a P type silicon substrate (P-sub) is provided. Shallow trench isolation (STI) regions 150 may be provided on the substrate 10. A deep N well (DNW) 12 and a P well 24 may be formed in the substrate 10 using conventional ion implantation methods.

Figure 6:
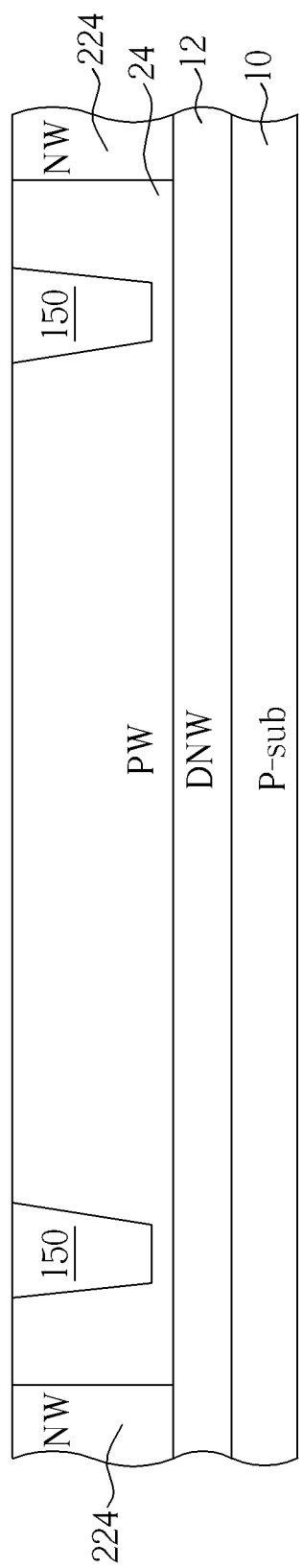

As shown in FIG. 6, subsequently, ion implantation processes may be carried out to form N well 224 in the substrate 10. The N well 224 merges with the underlying deep N well 12 and together isolate the P well 24.

Figure 7:
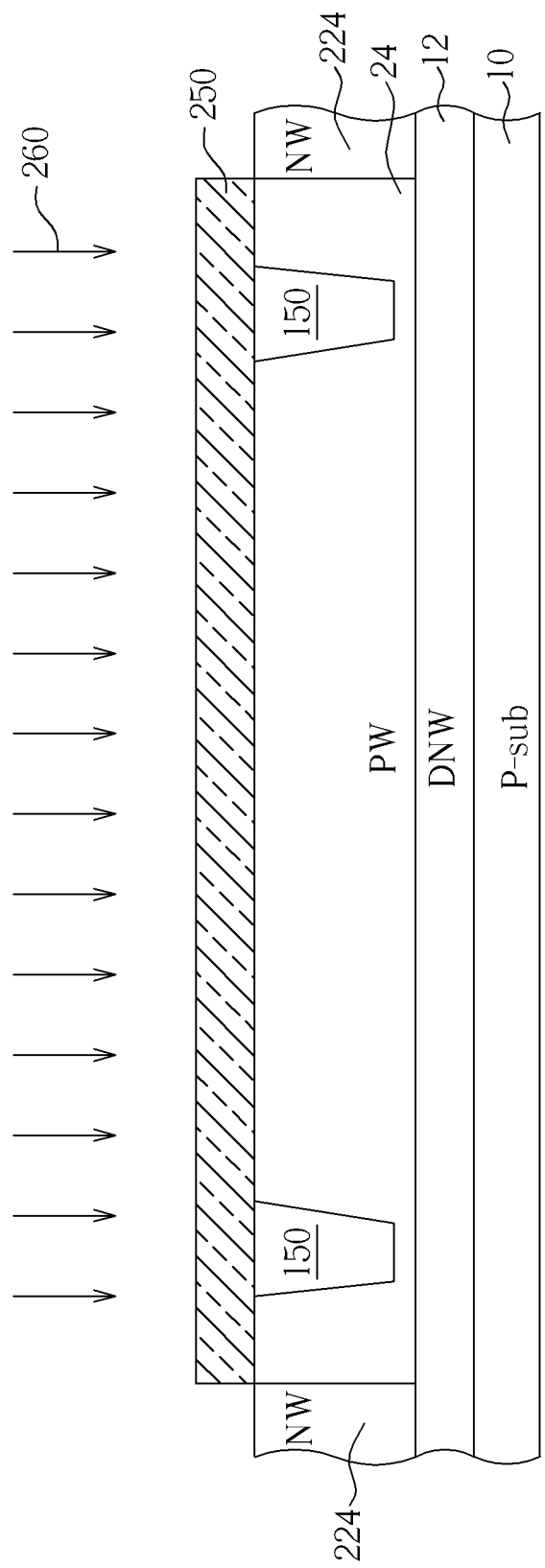

As shown in FIG. 7, a threshold voltage (Vt) implant block layer 250 such as a patterned photoresist layer may be provided on the substrate 10. The Vt implant block layer 250 is used to block the dopants of a threshold voltage implant process 260 from doping into the P well 24. The aforesaid threshold voltage implant process is a typical implant step for adjusting threshold voltage of transistor devices in core circuit or I/O circuit region. In another embodiment, the Vt implant block layer 250 at least masks a portion of the surface area of the P well 24, for example, the area over which polysilicon gate would be formed. Therefore, the region under the to be formed gate may not undergo a threshold voltage implant process. The beta gain of the bipolar transistor thus formed would be elevated. Additionally, even the entire area in which the transistor would be formed could be masked by the Vt implant block layer 250.

Figure 8:
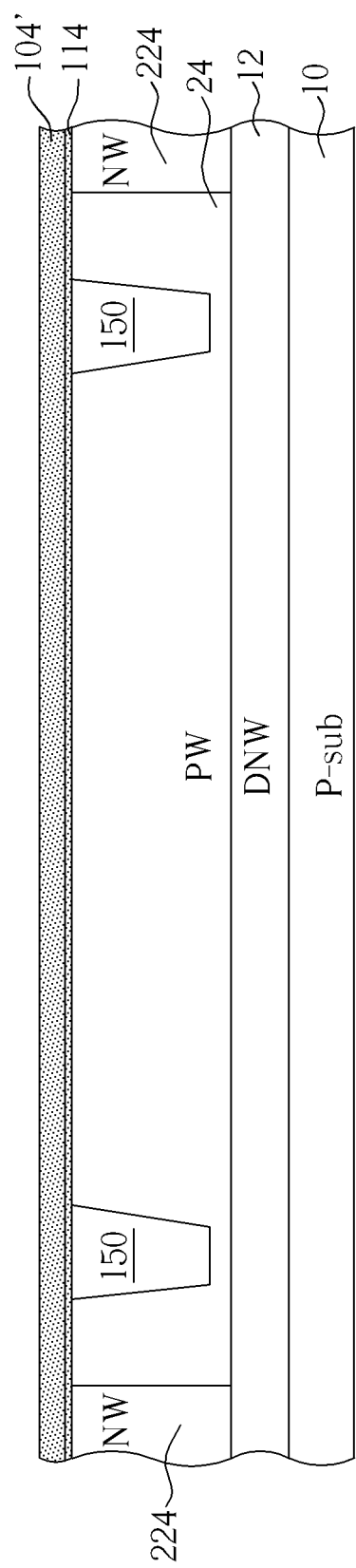

As shown in FIG. 8, the Vt implant block layer 250 is then removed. Subsequently, a gate dielectric layer 114 such as a silicon oxide layer may be formed on the substrate 10. A polysilicon layer 104' may then be deposited on the gate dielectric layer 114.

Figure 9:
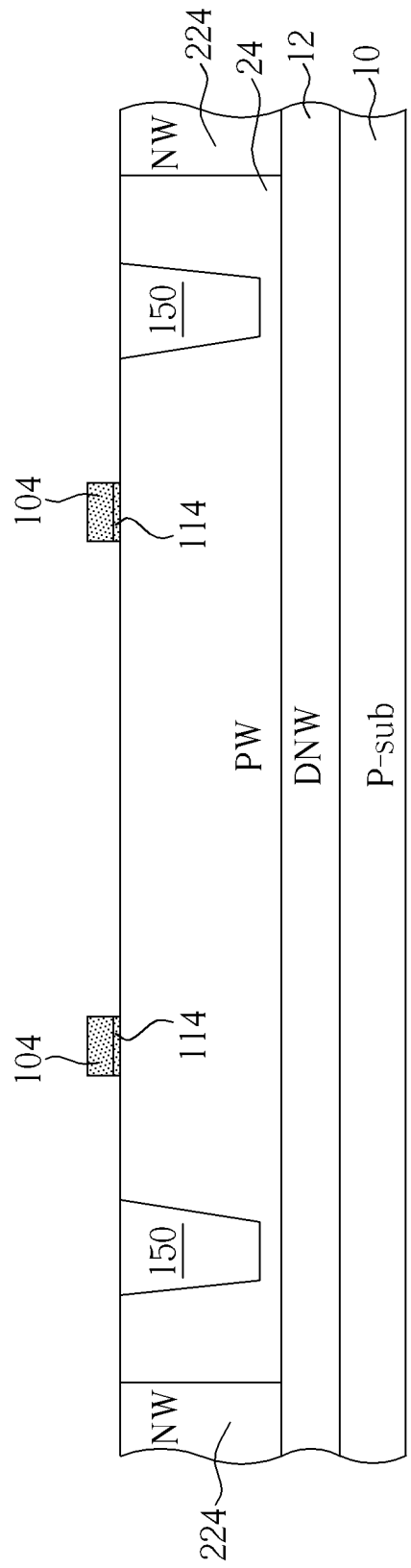

As shown in FIG. 9, a conventional lithographic process and a conventional dry etching process may be performed to pattern the polysilicon layer 104' and the gate dielectric layer 114 into a polysilicon gate 104. According to this invention, the polysilicon gate 104 is annular shaped and can be best seen in FIG. 1.

Figure 10:
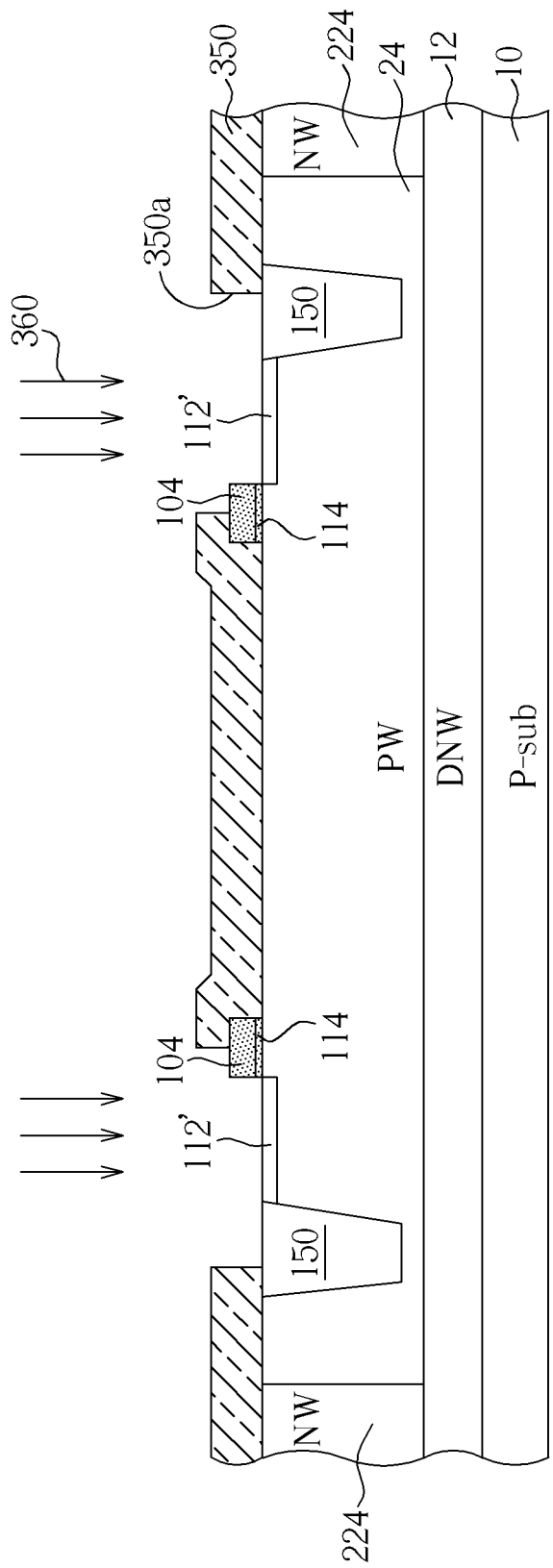

As shown in FIG. 10, after the formation of the polysilicon gate 104, a lightly doped drain (LDD) block layer 350 such as a patterned photoresist layer may be introduced to mask a portion of the surface area of the substrate 10. The LDD block layer 350 may have an annular opening 350a that exposes an annular region along an outer side of the annular polysilicon gate 104. The LDD block layer 350 masks the central area within the annular polysilicon gate 104. A conventional LDD implant process 360 may then be carried out to implant dopants such as arsenic or the like into the substrate 10 through the opening 350a, thereby forming LDD regions 112'.

Figure 11:
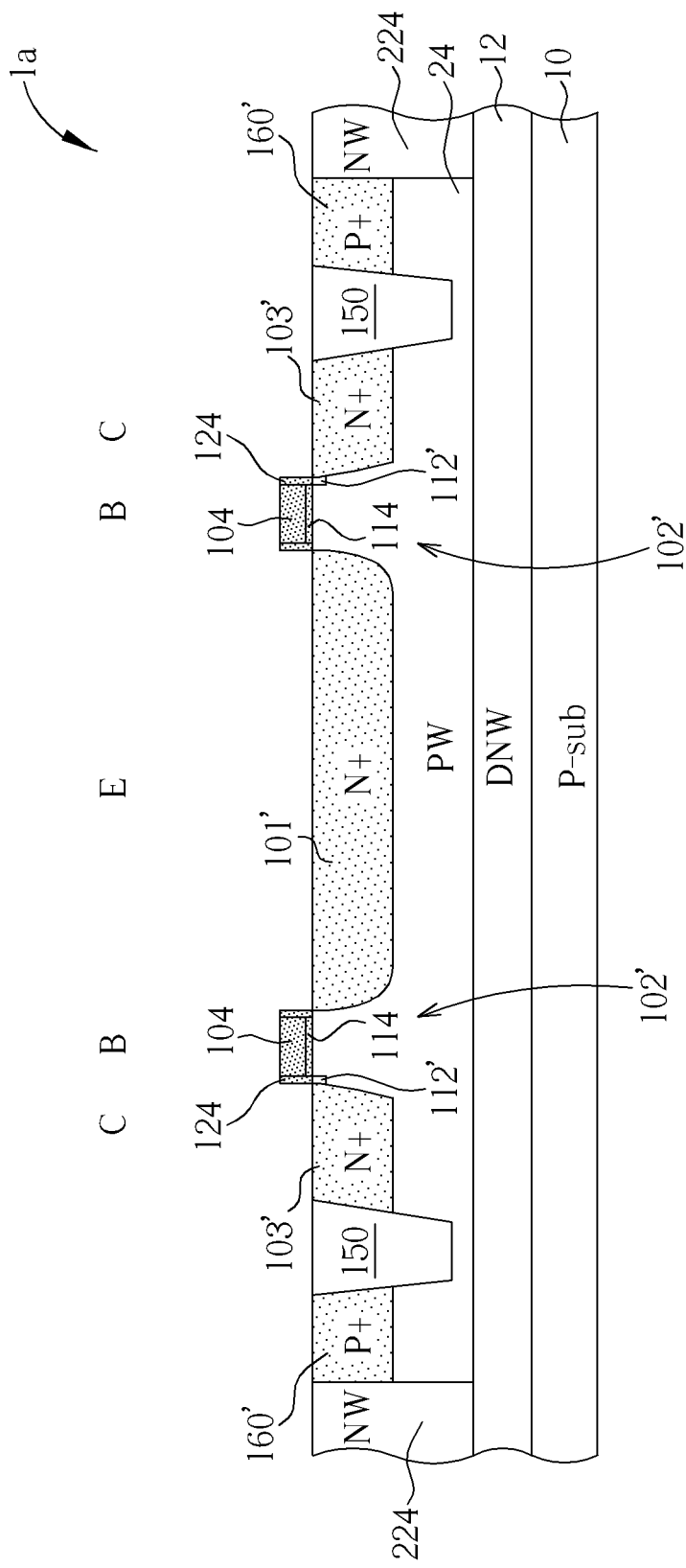

As shown in FIG. 11, subsequently, spacers 124 such as silicon nitride or silicon oxide sidewall spacers are formed on respective sidewalls of the polysilicon gate 104. Thereafter, a conventional source/drain ion implantation process may be performed to form N+ doping regions 101', 103' and P+ doping region 160' in the P well 24. The N+ doping region 101' may act as an emitter region of the lateral NPN bipolar transistor 1a, while the N+ doping region 103' may act as a collector region of the lateral NPN bipolar transistor 1a. A base region (B) is underneath the polysilicon gate 104.

Figure 12:
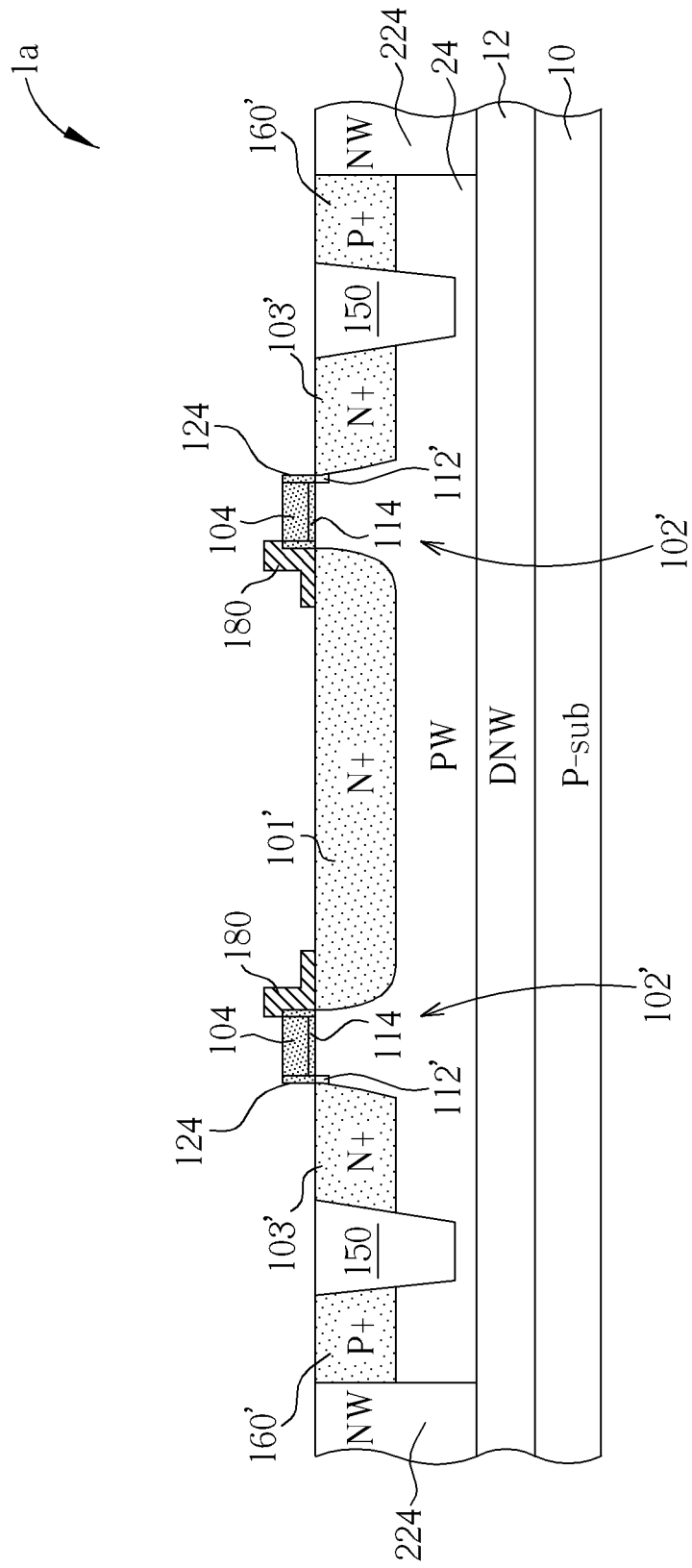

As shown in FIG. 12, an annular salicide block (SAB) layer 180 may be formed over periphery portion of the emitter region 101' and may extend up the surface of the spacer 124 facing the emitter region 101' or may extend to the top surface of the polysilicon gate 104. The SAB layer 180 may be composed of a dielectric material such as silicon oxide or silicon nitride.

Figure 13:
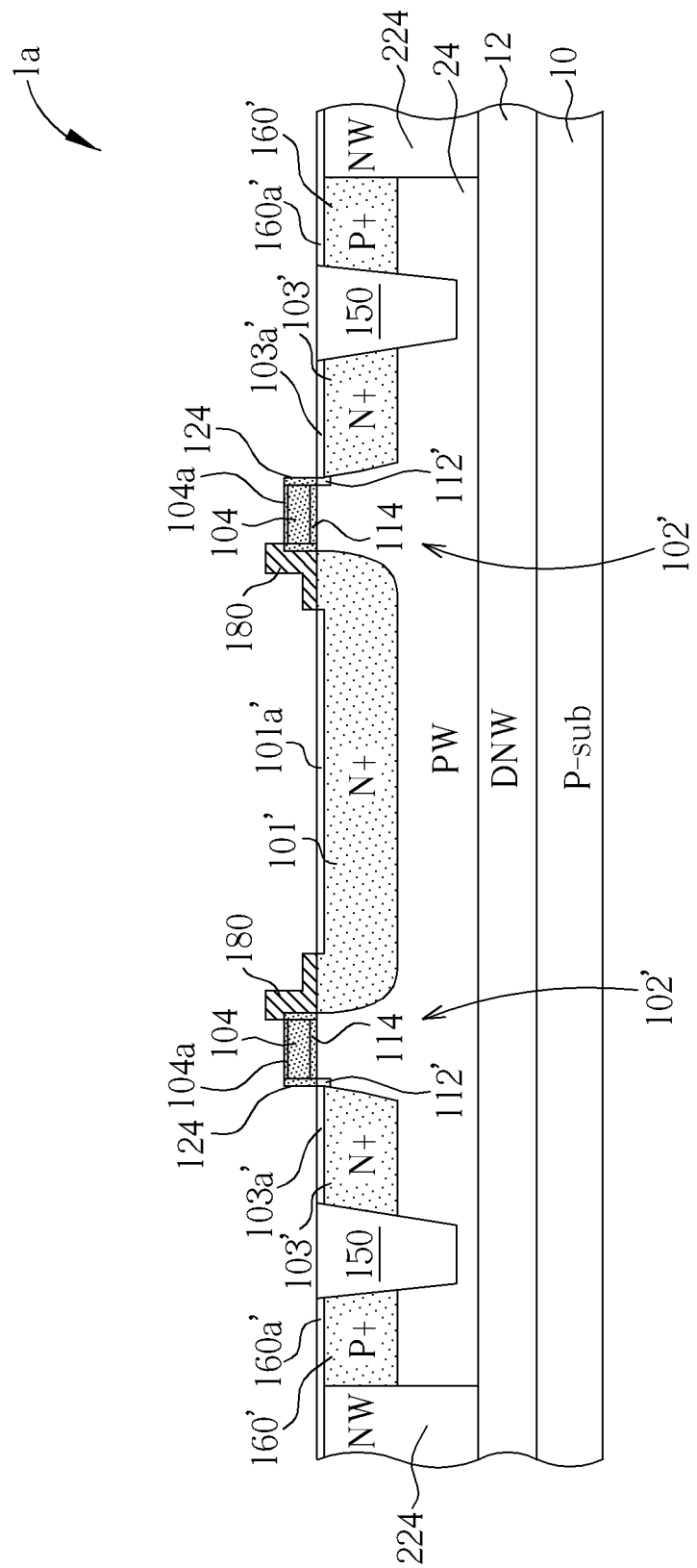

As shown in FIG. 13, after the formation of the SAB layer 180, an emitter salicide 101a' may be formed on the exposed portion of the emitter region 101'. Thus, the emitter salicide 101a' is pulled back from the periphery of the emitter region 101'. In addition, a collector salicide 103a', a polycide 104a, and a base salicide 160a' may be formed on the collector region 103', on the gate 104 and on the annular $P^+$ base contact 160', respectively. The SAB layer 180 prevents formation of the emitter salicide 101a' at the periphery of the emitter region 101' adjacent to the edge of the spacer 124 facing the emitter region 101'. It is noteworthy that no SAB layer is formed on the collector region 103' or on the spacer 124 facing the collector region 103'.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lateral PNP bipolar junction transistor, comprising:
    a P+ emitter region;
    an N type base region disposed about a periphery of the P+ emitter region;
    a gate disposed at least over a portion of the N type base region;
    a P+ collector region disposed about a periphery of the N type base region;
    a salicide block layer disposed over at least a portion of a periphery of the emitter region; and
    an emitter salicide formed on an exposed portion of the emitter region that is not covered by the salicide block layer, wherein the salicide block layer is disposed between the emitter salicide and the gate, and the salicide block layer remains on the finished lateral PNP bipolar junction transistor.

2. The lateral PNP bipolar junction transistor according to claim 1 further comprises a P type lightly doped drain situated directly underneath a spacer of the gate only on a side adjacent to the P+ collector region.

3. The lateral PNP bipolar junction transistor according to claim 2 wherein no LDD is provided on the other side adjacent to the P+ emitter region.

4. The lateral PNP bipolar junction transistor according to claim 1 wherein the P+ emitter region has a polygonal shape.

5. The lateral PNP bipolar junction transistor according to claim 1 wherein a gate dielectric layer is provided between the gate and the N type base region.

* * * * *